US010023492B2

(12) United States Patent
Aitken et al.

(10) Patent No.: US 10,023,492 B2
(45) Date of Patent: Jul. 17, 2018

(54) BISMUTH BORATE GLASS ENCAPSULANT FOR LED PHOSPHORS

(71) Applicant: CORNING INCORPORATED, Corning, NY (US)

(72) Inventors: Bruce Gardiner Aitken, Corning, NY (US); Michael Edward Badding, Campbell, NY (US); Nicholas Francis Borrelli, Elmira, NY (US); Nadja Teresia Lonnroth, Corning, NY (US); Mark Alejandro Quesada, Horseheads, NY (US)

(73) Assignee: CORNING INCORPORATED, Corning, NY (US)

( * ) Notice: Subject to any disclaimer, the term of this patent is extended or adjusted under 35 U.S.C. 154(b) by 0 days.

(21) Appl. No.: 15/467,494

(22) Filed: Mar. 23, 2017

(65) Prior Publication Data

US 2017/0190609 A1    Jul. 6, 2017

Related U.S. Application Data

(62) Division of application No. 14/665,634, filed on Mar. 23, 2015, now Pat. No. 9,624,124, which is a division of application No. 13/852,048, filed on Mar. 28, 2013, now Pat. No. 9,011,720.

(60) Provisional application No. 61/618,194, filed on Mar. 30, 2012.

(51) Int. Cl.

| C03C 3/14 | (2006.01) |
|---|---|
| C03C 3/066 | (2006.01) |
| C03C 8/04 | (2006.01) |
| C03C 14/00 | (2006.01) |
| C03C 3/19 | (2006.01) |
| C03C 3/145 | (2006.01) |
| C03C 3/15 | (2006.01) |
| C03C 3/068 | (2006.01) |
| C03C 3/23 | (2006.01) |
| C03C 8/24 | (2006.01) |
| C03B 19/02 | (2006.01) |
| C03B 19/06 | (2006.01) |
| C03C 17/00 | (2006.01) |

(52) U.S. Cl.
CPC ............ *C03C 14/006* (2013.01); *C03B 19/02* (2013.01); *C03B 19/06* (2013.01); *C03C 3/066* (2013.01); *C03C 3/068* (2013.01); *C03C 3/14* (2013.01); *C03C 3/145* (2013.01); *C03C 3/15* (2013.01); *C03C 3/19* (2013.01); *C03C 3/23* (2013.01); *C03C 8/24* (2013.01); *C03C 17/007* (2013.01); *C03C 2214/04* (2013.01)

(58) Field of Classification Search
CPC .............. C03C 8/02; C03C 8/04; C09K 11/02
See application file for complete search history.

(56) References Cited

U.S. PATENT DOCUMENTS

| 6,572,785 B2 | 6/2003 | Justel et al. |
|---|---|---|
| 7,319,289 B2 | 1/2008 | Suehiro et al. |
| 7,442,326 B2 | 10/2008 | Setlur et al. |
| 7,811,471 B2 | 10/2010 | Iwao et al. |
| 7,825,575 B2 | 11/2010 | Sawanobori et al. |
| 7,989,236 B2 | 8/2011 | Yamaguchi et al. |
| 8,206,613 B2 | 6/2012 | Fujita et al. |
| 8,344,404 B2 | 1/2013 | Fujita et al. |
| 8,690,629 B2 | 4/2014 | Becker et al. |
| 8,822,032 B2 | 9/2014 | Borrelli et al. |
| 2008/0074029 A1 | 3/2008 | Suehiro |
| 2008/0284315 A1 | 11/2008 | Tasumi et al. |
| 2009/0173960 A1 | 7/2009 | Martin et al. |
| 2009/0186433 A1 | 7/2009 | Yamaguchi et al. |
| 2009/0309125 A1 | 12/2009 | Matsumoto et al. |
| 2010/0102344 A1 | 4/2010 | Ueji |
| 2010/0263723 A1 | 10/2010 | Allen et al. |
| 2012/0074447 A1 | 3/2012 | Matsumoto et al. |
| 2012/0293981 A1 | 11/2012 | Motoya et al. |
| 2013/0015761 A1 | 1/2013 | Motoya et al. |
| 2013/0049575 A1 | 2/2013 | Fujita et al. |

FOREIGN PATENT DOCUMENTS

| DE | 102008021438 | 12/2009 |
|---|---|---|
| EP | 0582716 | 2/1994 |
| EP | 1880983 | 2/2008 |
| EP | 2036965 | 3/2009 |
| JP | 2003034550 | 2/2003 |
| JP | 2003258308 | 9/2003 |
| JP | 2006160599 | 6/2006 |
| JP | 2008019109 | 1/2008 |
| JP | 2008031001 | 2/2008 |
| JP | 2008088046 | 4/2008 |
| JP | 2008098147 | 4/2008 |
| JP | 2008169348 | 7/2008 |
| JP | 2011230965 | 11/2011 |
| JP | 2012031002 | 2/2012 |
| JP | 2012031328 | 2/2012 |
| JP | 2012044225 | 3/2012 |

(Continued)

OTHER PUBLICATIONS

V. Diez-Blanco et al; "Waveguide Structures Written in SF57 Glass With FS-Laser Pulses Above the Critical Self-Focusing Threshold"; Applied Surface Science, 252 (2006) 4523-4526.
Mueller-Mach et al; "Highly Efficient All-Nitride Phosphor-Converted White Light Emitting Diode"; Phys. Stat. Sol. (A) 202, No. 9, 1727-1732 (2005).
Park et al; "Enhanced Luminescence Efficiency for BI, EU Doped Y2O3 Red Phosphors for White LEDs" Solid State Phenomena vols. 124-126 (2007) pp. 379-382.
Xie et al; "Rare-Earth Activated Nitride Phosphors; Synthesis Luminescence and Applications" Materials, 2010, 3, 3777-3793.

(Continued)

*Primary Examiner* — Karl E Group

(57) ABSTRACT

Embodiments are directed to glass frits containing phosphors that can be used in LED lighting devices and for methods associated therewith for making the phosphor containing glass frit and their use in glass articles, for example, LED devices.

6 Claims, 3 Drawing Sheets

(56) References Cited

FOREIGN PATENT DOCUMENTS

| JP | 2012158494 | 8/2012 |
|----|------------|--------|
| JP | 2012180488 | 9/2012 |
| KR | 2009063408 | 6/2009 |
| KR | 2010135223 | 12/2010 |
| TW | I392110 | 4/2013 |
| WO | 2009132840 | 11/2009 |
| WO | 2011013505 | 2/2011 |
| WO | 2011065322 | 6/2011 |
| WO | 2011111462 | 9/2011 |
| WO | 2012100132 | 7/2012 |
| WO | 2013001971 | 1/2013 |

OTHER PUBLICATIONS

Xie et al; "Silicon-Based Oxynitride and Nitride Phosphors for White LEDs—A Review" Science and Technology of Advanced Materials 8 (2007) 588-600.

Won et al; "Effect of Phosphor Geometry on the Luminous Efficiency of High-Power White Light-Emitting Diodes With Excellent Color Rendering Property"; Optics Letters, (2009) vol. 34, No. 1 pp. 1-3.

International Search Report and Written Opinion, dated Jul. 8, 2013, International Application No. PCT/US2013/034023.

BISMUTH BORATE GLASS ENCAPSULANT FOR LED PHOSPHORS

This is a divisional application and claims the benefit of priority under 35 U.S.C. § 120 of U.S. application Ser. No. 14/665,634 filed Mar. 23, 2015, now U.S. Pat. No. 9,624,124, which is a divisional application and claims the benefit of priority under 35 U.S.C. § 120 of U.S. application Ser. No. 13/852,048 filed Mar. 28, 2013, now U.S. Pat. No. 9,011,720, which in turn claims the benefit of priority under 35 U.S.C. § 119 of U.S. Provisional Application Ser. No. 61/618,194 filed on Mar. 30, 2012, the contents of which are relied upon and incorporated herein by reference in their entirety.

FIELD

The disclosure is directed to glass frits containing phosphors that can be used in LED lighting devices and for methods associated therewith for making the phosphor containing glass frit and their use in glass articles, for example, LED devices.

TECHNICAL BACKGROUND

Yellow and red phosphors can be used to create white light emitting GaN-based LEDs. These phosphors are typically encapsulated by a silicone. The latter material tends to yellow or darken over time. Moreover, due to its lower refractive index relative to that of the phosphor, the resultant backscatter degrades the LED efficiency. Previous work has demonstrated the efficacy of a glass encapsulant with low characteristic temperatures, particularly one that is index-matched to the phosphor as described in commonly-assigned U.S. patent application Ser. No. 13/281,671 filed on Oct. 26, 2011, the content of which is incorporated herein by reference in its entirety. However, the index-matched glasses developed to date for this application have typically contained Pb, which has since been deemed an inadmissible component.

Accordingly, there is a need for comparable Pb-free encapsulant glasses that can be index-matched to the LED phosphors and that can function as a sealing frit at temperatures below the upper use limit of the phosphors.

SUMMARY

This disclosure is directed to the encapsulation of phosphors in a glass material that does not degrade or become brittle over time, is thermally robust and has a better refractive index match to the phosphor, reducing efficiency-robbing backscatter of blue light back into the LED.

One embodiment is an article comprising a glass layer, wherein the layer comprises a glass comprising $Bi_2O_3$ and at least 30 mol % $B_2O_3$; and at least one phosphor, wherein the layer is a fired mixture of a frit comprising the $Bi_2O_3$ and $B_2O_3$ and the at least one phosphor, and wherein the layer is Pb free.

Another embodiment is a method for making a glass article, the method comprising:
providing a glass composition comprising $Bi_2O_3$ and $B_2O_3$;
melting the composition and forming the melted composition into a glass;
grinding the glass into particles to form a frit glass having the composition;
blending the frit glass with one or more phosphors to form a phosphor-frit glass mixture;
converting the phosphor-frit glass mixture into a paste by adding at least one organic liquid to the mixture;
applying the paste onto a surface; and
firing the applied paste to burn out organic material to form a phosphor-frit glass.

Another embodiment is a glass composition comprising in mole percent:
10-30% $Bi_2O_3$;
greater than 0% $Na_2O$;
15-50% ZnO, $ZnF_2$, or a combination thereof;
30-55% $B_2O_3$;
0-3% $SiO_2$;
0-1% $WO_3$;
0-12% BaO, CaO, SrO, or combinations thereof.

Embodiments may have one or more of the following advantages: the consolidated phosphor-containing glass layer and a device comprising the glass phosphor-containing layer are thermally more robust than when a silicone is used as the encapsulation material; the consolidated phosphor-containing glass layer has better chemical and environmental stability; there is a better refractive index match between the consolidated phosphor-containing layer and the layer containing the LED, which reduces backscatter, the ability to maintain a quantum efficiency of the phosphor in the glass of greater than 90% (e.g., greater than 95%), the ability to make the composites at a thickness as small as 100 um, the ability to maintain a processing temperature of less than about 520° C. so as not to thermally degrade the phosphor, the capability of combining different phosphors into a single layer, the ability to make geometric patterns of the phosphor on the substrate; the ability to control the packaged LED color or white point; and/or since the phosphor plate is made as a separate piece, the optical thickness and emission color can be measured before assembly, thus reducing the number of reject LEDs. Further, the Pb-free encapsulant glasses can be index-matched to the LED phosphors and can function as a sealing frit at temperatures below the upper use limit of the phosphors.

In related embodiments, a solid glass layer comprises a glass matrix and at least one phosphor dispersed throughout the matrix, wherein the glass comprises $Bi_2O_3$ and at least 30 mol % $B_2O_3$.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTIONS OF THE DRAWINGS

DETAILED DESCRIPTION

Figure 1:
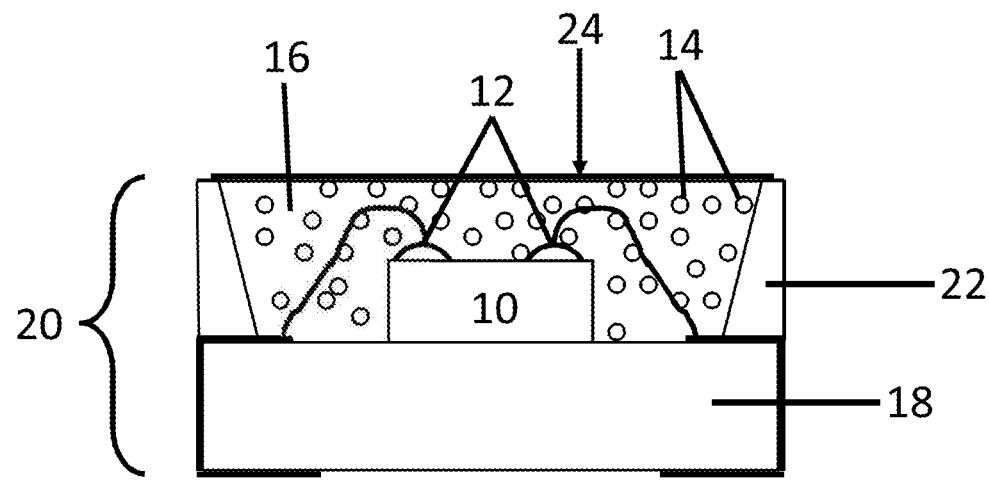
FIG. 1 is an illustration of features of a device in which phosphors encapsulated in a silicone materials are applied to and encapsulates a LED device in a vessel.

Reference will now be made in detail to various embodiments of phosphor/frit glass materials and their use in LED articles, examples of which are illustrated in the accompanying drawings. Whenever possible, the same reference numerals will be used throughout the drawings to refer to the same or like parts.

One embodiment is an article comprising a glass layer, wherein the layer comprises a glass comprising $Bi_2O_3$ and at least 30 mol % $B_2O_3$; and at least one phosphor, wherein the layer is a fired mixture of a frit comprising the $Bi_2O_3$ and $B_2O_3$ and the at least one phosphor, and wherein the layer is Pb free.

Another embodiment is a method for making a glass article, the method comprising:
  providing a glass composition comprising $Bi_2O_3$ and at least 30 mol % $B_2O_3$;
  melting the composition and forming the melted composition into a glass;
  grinding the glass into particles to form a frit glass having the composition;
  blending the frit glass with one or a more phosphors to form a phosphor-frit glass mixture;
  converting the phosphor-frit glass mixture into a paste by adding at least one organic liquid to the mixture;
  applying the paste onto a surface; and
  firing the applied paste to burn out organic material to form a phosphor-frit glass.

Another embodiment is a method for making a glass article comprising:
  providing a glass composition comprising $Bi_2O_3$ and at least 30 mol % $B_2O_3$;
  melting the composition and forming the melted composition into a glass;
  grinding the glass into particles to form a frit glass having the composition;
  blending the frit glass with one or more phosphors to form a phosphor-frit glass mixture;
  milling the phosphor-frit glass mixture;
  sieving the milled phosphor-frit glass mixture;
  converting the milled and sieved phosphor-frit glass mixture into a paste by adding at least one organic liquid to the mixture;
  applying the paste onto a surface; and
  firing the paste to burn out the organic material.

In various embodiments, the layer is Pb free.

Another embodiment is a glass composition comprising in mole percent:
  10-30% $Bi_2O_3$;
  greater than 0% $Na_2O$;
  15-50% ZnO, $ZnF_2$, or a combination thereof;
  30-55% $B_2O_3$;
  0-3% $SiO_2$;
  0-1% $WO_3$;
  0-12% BaO, CaO, SrO, or combinations thereof.

The glass composition, according to some embodiments, comprises at least 1% $Na_2O$.

The glass composition, according to some embodiments, comprises 15-50% ZnO.

The glass composition, according to some embodiments, comprises:
  12-20% $Bi_2O_3$;
  5-12% $Na_2O$;
  20-30% ZnO;
  38-52% $B_2O_3$;
  0-3% $SiO_2$;
  0-1% $WO_3$;
  1-12% BaO, CaO, SrO, or combinations thereof.

The glass composition, according to some embodiments, comprises:
  14-16% $Bi_2O_3$;
  5-11% $Na_2O$;
  22-27% ZnO;
  40-51% $B_2O_3$;
  0-3% $SiO_2$;
  0-1% $WO_3$;
  1-11% BaO, CaO, SrO, or combinations thereof.

The glass composition, according to some embodiments, has a refractive index of 1.81-1.83 at 473 nm and a glass transition temperature of 460° C. or less.

The article, according to some embodiments, comprises a glass comprising in mole percent:
  10-30% $Bi_2O_3$;
  0-20% $M_2O$, wherein M is Li, Na, K, Cs, or combinations thereof;
  0-20% RO, wherein R is Mg, Ca, Sr, Ba, or combinations thereof;
  15-50% ZnO, $ZnF_2$, or a combination thereof;
  0-5% $Al_2O_3$;
  0-5% $P_2O_5$; and
  30-55% $B_2O_3$.

The article, according to some embodiments, comprises a glass comprising:
  0-6 $Li_2O$;
  0-20 $Na_2O$;
  0-10 $K_2O$; and
  0-3 $Cs_2O$.

The article, according to some embodiments, comprises a glass comprising:
  0-3 MgO;
  0-3 CaO;
  0-20 BaO; and
  0-3 SrO.

The article, according to some embodiments, comprises a glass further comprising 0-5% $TiO_2$, $ZrO_2$, $Ta_2O_5$, $MoO_3$, $WO_3$, or combinations thereof.

The article, according to some embodiments, comprises a glass further comprising 0-15% $SiO_2$.

The article, according to some embodiments, comprises a glass further comprising 0-5% of one or more rare-earth dopants.

The article, according to some embodiments, comprises a glass comprising 0-5% of $Eu_2O_3$.

The article, according to some embodiments, comprises a glass comprising in mole percent:
  10-30% $Bi_2O_3$;
  greater than 0% $Na_2O$;

15-50% ZnO, ZnF$_2$, or a combination thereof;
30-55% B$_2$O$_3$;
0-3% SiO$_2$;
0-1% WO$_3$;
0-12% BaO, CaO, SrO, or combinations thereof.

The article, according to some embodiments, comprises a glass comprising at least 1% Na$_2$O.

The article, according to some embodiments, comprises a glass comprising 15-50% ZnO.

The article, according to some embodiments, comprises a glass comprising:
12-20% Bi$_2$O$_3$;
5-12% Na$_2$O;
20-30% ZnO;
38-52% B$_2$O$_3$;
0-3% SiO$_2$;
0-1% WO$_3$;
1-12% BaO, CaO, SrO, or combinations thereof.

The article, according to some embodiments, comprises a glass comprising:
14-16% Bi$_2$O$_3$;
5-11% Na$_2$O;
22-27% ZnO;
40-51% B$_2$O$_3$;
0-3% SiO$_2$;
0-1% WO$_3$;
1-11% BaO, CaO, SrO, or combinations thereof.

The glass can further comprise 0-5% TiO$_2$, ZrO$_2$, Ta$_2$O$_5$, MoO$_3$, WO$_3$, or combinations thereof. The glass can further comprise 0-5% of one or more alkaline earth metals. The glass can also further comprise 0-25% SiO$_2$.

In some embodiments, the glass has a refractive index in the range of from 1.8 to 1.9. The glass can have a glass transition temperature of 460° C. or less. The difference in refractive index between the frit and the at least one phosphor can be ≤0.20 (e.g., less than 0.2 or less than 0.1) in some embodiments.

In one embodiment, the surface can be either a surface of a substrate or surface of a carrier substrate, for example, a glass or tape, respectively. The article can further comprise a substrate having the glass layer disposed thereon. The CTE of the glass layer and the substrate can be within ±2×10$^{-6}$ of each other.

In one embodiment, the substrate can be a glass substrate. The glass substrate can have a thickness of 5 mm or less, for example, 4 mm or less, for example, 3 mm or less, for example, 2 mm or less, for example, 1 mm or less, for example, 0.5 mm or less. The glass substrate can be a thin flexible glass substrate.

In one embodiment, the carrier substrate can be a tape or substrate in which the glass layer can be removed from after it is made. The glass layer can be removed from the carrier and then attached to another surface after fabrication and also fired on its own. The glass layer can have a thickness of 5 mm or less, for example, 4 mm or less, for example, 3 mm or less, for example, 2 mm or less, for example, 1 mm or less, for example, 0.5 mm or less, for example, 0.4 mm or less, for example, 0.3 mm or less, for example, 0.2 mm or less, for example, 0.1 mm or less, for example, 0.09 mm or less, for example, 0.08 mm or less, for example, 0.07 mm or less, for example, 0.06 mm or less, for example, 0.05 mm or less. In some embodiments, the glass layer has a thickness of from 0.01 to 1 mm, for example, from 0.01 mm to 0.2 mm.

The glass layer, on the substrate or alone, can be used to fabricate LED lights in for example, fabrication processes such as wafer sized processes, for example, 6 inches by 6 inches or even larger. Multiple LEDs can be fabricated on the glass layer and separated into single LEDs after fabrication.

In an embodiment one or more phosphors are mixed with a glass frit material (the encapsulating material) to form a phosphor-frit glass mixture, and then applied to an LED, for example, a GaN or InGaN LED, within a vessel. In FIG. 2, which is similar to FIG. 1, a phosphor 114 (illustrated as circular dots) has been mixed with a glass frit material 116 to form a phosphor-frit glass mixture which is fired to create a glass sheet having a phosphor embedded into it. In addition, package 120 shown in FIG. 2 illustrates the LED 110, wire bonds 112 and package substrate 118 and the vessel or cup 122. The phosphor-containing frit glass mixture (114,116) can also be applied to a substrate using standard paste processes, by a screen printing, or by spraying, followed by firing to produce a dense glass layer, the phosphor/frit layer, overlying the foregoing substrate. Since the fired phosphor-containing frit mixture is a glass, a cover lens may not be required. This disclosure is directed to the preparation, application, and thermal processing of the mixed frit/phosphor materials in the form shown in FIG. 2. The disclosure further includes a choice of frit glass compositions that can be used to provide the correct thermal characteristics while being consistent with the addition of the phosphor and its application to an appropriate glass substrate.

In various embodiments, the Bi-containing borate glasses are envisaged to be used as encapsulating frits in either of two methodologies. In one case, a mixture of powdered glass and phosphor, blended with a suitable organic binder, dispersant and solvent, is screen printed onto a thin, high thermal expansion coefficient glass substrate. Examples of the substrate include any of the high Na content aluminosilicate glasses that Corning manufactures via the fusion process. Screen printing typically involves the deposition of multiple layers in order to build up a phosphor-frit layer of sufficient thickness. The substrate/frit assembly is then fired at ~350° C. in order to burn off the organic constituents of the paste, and then subsequently heated to 500-550° C. to sinter the frit to a sufficiently transparent state. In embodiments, the binder can be fully removed or substantially removed from the glass composition prior to sintering. As such, the temperature at which binder burnout occurs can be less than the sintering temperature. In further embodiments, the loading of phosphor in the sintered glass can range from about 1 to 30 vol. %, e.g., 1, 2, 5, 10, 15, 20 or 30 percent by volume. In order to avoid reduction of Bi, the sintering may be carried out in an O$_2$-enriched atmosphere rather than air. Exemplary glasses 15, 10, 29, 31, 71, 84 and 97 from the tables have been processed in this fashion to yield an encapsulated phosphor layer of sufficient transparency (e.g., at least 60% or at least 70%).

In another embodiment, a free-standing frit/phosphor film is made by a tape casting procedure. Exemplary glass sample 29 and Ce:YAG phosphor powders were jet milled to d50 of <5 um. A tape casting slip was prepared by mixing the powders in a proportion of 85 volume % exemplary glass 29 and 68 (from the Tables below) and 15 volume % Ce:YAG in ethyl acetate solvent with Emphos PS-236 dispersant and polypropylene carbonate binder. Slip was cast using a 22-mil draw-down blade on teflon carrier film. The tape was dried, released and sintered at 550° C. in air. The sample remains substantially glassy after such treatment. Polypropylene carbonate was chosen as binder as we found it critical to employ a binder which burns out at <300° C. in order to prevent trapping of organics in the sintered glass matrix. The tape was sintered on a fibrous alumina setterboard with alumina felt as a cover. The fibrous board limits bonding of the glass to the setter during firing. Precise dimensioned parts were cut from the sintered tape using an ablative laser cutting system with an Nd:YVO4 laser at 355 nm. The final thickness of the Ce:YAG in glass sample was 100 um, though thicknesses in the range of 50 to 250 microns are contemplated.

Casting uniformity was improved with polypropylene carbonate (PPC) binder using a solvent system comprising dimethylcarbonate (DMC) and propylene glycol diacetate (PGD). Of the relatively limited set of solvents known to solubilize PPC, DMC and PGD are advantageous in that they are relatively non-toxic, readily dissolve PPC and the solvent evaporation rate can be tuned by adjusting the proportion of PGD (low volatility) to DMC (high volatility).

A smooth setter board is advantageous to improve the surface finish of the fired composite. The glass compositions described herein fire at a relatively low temperature of about 600° C. or less. At this temperature, stainless steel setter boards with a smooth surface may be used. Lower firing temperature can eliminate or substantially minimize the issue of glass reaction with the phosphor particle.

The particle size distribution of the glass frit may be instrumental in achieving good optical performance, especially high quantum efficiency. Much improved performance is found if the glass powder average particle size is above about 10 um. It is believed larger glass particle size mitigates reduction of $Bi_2O_3$ contained in the glass during sintering of the glass/phosphor composite. Composites made with a glass having a particle size distribution d50 under 1 um are less transparent than composites made with the same glass at a d50 of over 1 um, for example, over 10 um. It is also anticipated that, in the case of a YAG-based phosphor, which has similar density to the glass compositions described herein, that the particle size be similar to reduce segregation of the glass and phosphor particles during drying of the green tape.

Figure 3:
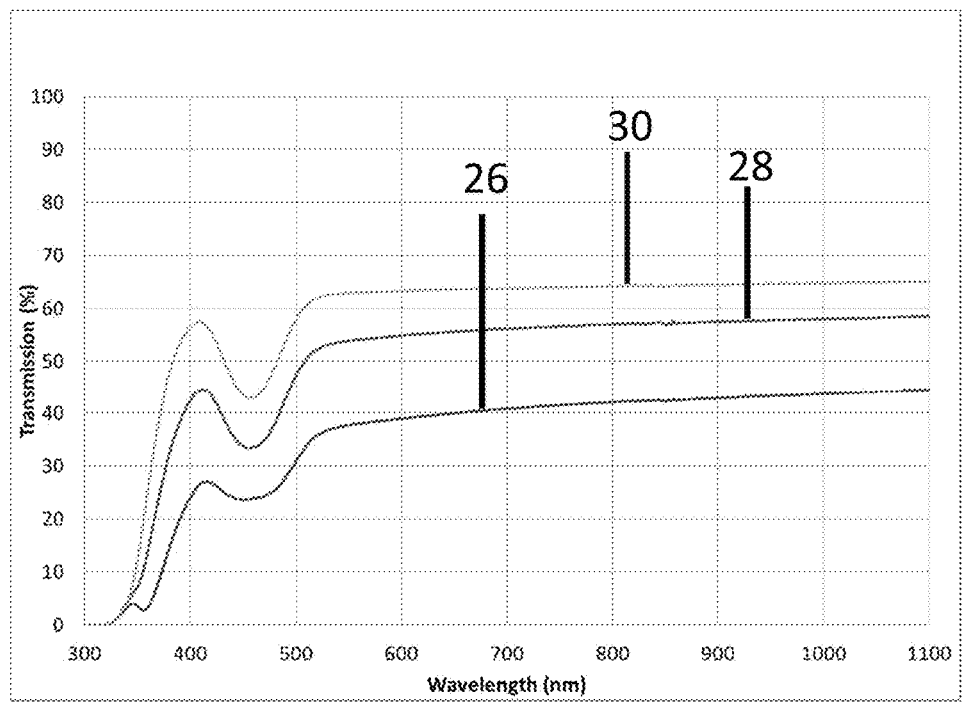
FIG. 3 is a graph comparing the total transmission spectra of tape cast glass-phosphor films made from the same glass composition, but different particle size.

FIG. 3 is a graph comparing the total transmission spectra of tape cast glass-phosphor films made from the same glass composition, but different particle size. The glass composition is summarized in Example 76 (from the Tables below) with Ce:YAG phosphor particles. The films were fired under the same conditions, and produced dense, self-supporting films which were ~100 um thick. Particle size is indicated by the conventional "d50" measurement which indicates the size where 50% by volume of the particles are below the indicated size. The data clearly show membranes made with submicron glass powder show browning of the glass which reduces transmission, especially in the region near 400 nm, which interferes with the Ce:YAG phosphor absorption peak centered near 450 nm. Lines 26, 28, and 30 show d50=0.81 um, d50=3.55 um, and d50=15.85 um, respectively. The film fabricated from glass at d50=15.85 um measured a quantum efficiency of 97%. It is desirable to achieve a quantum efficiency of over 90%, more preferably 95% or more.

High performance membranes can be obtained with a volume fraction of phosphor in the range of 1% to 30%, for example, in the 5% to 30% range. Higher phosphor content allows for a higher sintering temperature, but requires a thinner film for optimal color point. Film thickness can be in the range of 30 to 1000 um, for example, 50 to 300 um, for example, 75 to 200 um.

In the case of Ce:YAG phosphor of conversion of blue LED light to white light, in order to achieve a desirable color point for converting blue LED to white light, the volume fraction of phosphor required varies inversely with film thickness, and can be described by the following: Vf=a/t, wherein Vf is expressed in % and t is in um, the constant a, with units um-%. Vf can be in the range of 1000 to 2000. For example for a film thickness of 100 um, the phosphor volume fraction can be in the range of 1000/100% to 2000/100% or 10% to 20%.

In various embodiments, one or both of the film thickness and the amount of the phosphor loading can be controlled in order to affect the color point of the glass layer.

EXAMPLE

A free-standing glass-phosphor composite was produced as follows: Drigaged exemplary glass 76 (from the Tables below) was dry ball-milled and sieved at −400 mesh to achieve a particle size distribution with d50=15.85 um. Commercially available Ce:YAG phosphor powder with d50=14 um was added to the glass powder in a 85 vol % glass/15 vol % phosphor ratio. PPC binder and a 50/50 solvent mix of DMC and PGD were added in the weight fractions shown in the below table. A commercial dispersant made by BYK company, Dispersbyk-142, was used. The ingredients were mixed in a planetary mixer to achieve a uniform tape casting slip. Slip was cast using a conventional 18-mil gap doctor blade on a Teflon-coated Mylar carrier film. After drying the cast green tape was released, cut to size and sintered on a stainless-steel setter board at 510° C. for 2 hours. At this temperature acceptable density and optical quality is achieved while minimizing the possibility of either excessive sticking of the part to setter board, or loss of dimensional tolerance through excessive glass flow which can occur at sintering temperature as little as 10° C. higher. Since the glass viscosity decreases exponentially with increasing temperature, furnace uniformity is critical. It is desirable to fire the part in a furnace with thermal gradient across the part less than 20° C., more preferably less than 10° C., most preferably less than 5° C. After firing, a part with precise dimensions was laser cut out of the fired casting to produce a 10 cm×10 cm part with a uniform thickness of 100+/−2 um. Quantum efficiency was measured at 97%. Table 1 shows the exemplary components and weight fractions.

TABLE 1

| Component | Weight fraction |
| --- | --- |
| Exemplary glass 76 | 0.545 |
| Ce:YAG phosphor | 0.095 |
| Polypropylene Carbonate | 0.041 |
| Dispersbyk-142 | 0.005 |
| Propylene Glycol Diacetate | 0.157 |
| Dimethyl Carbonate | 0.157 |

Figure 4:
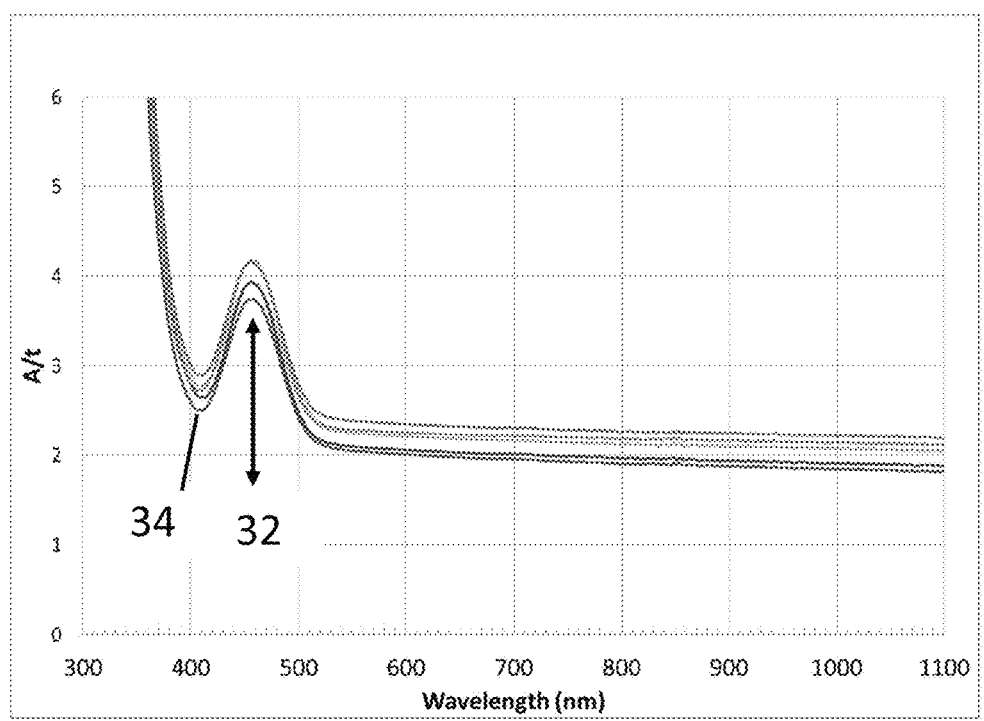
FIG. 4 is a graph showing thickness normalized absorbance as function of wavelength for different glass frit-phosphor blends fired at different temperatures.
Figure 5:
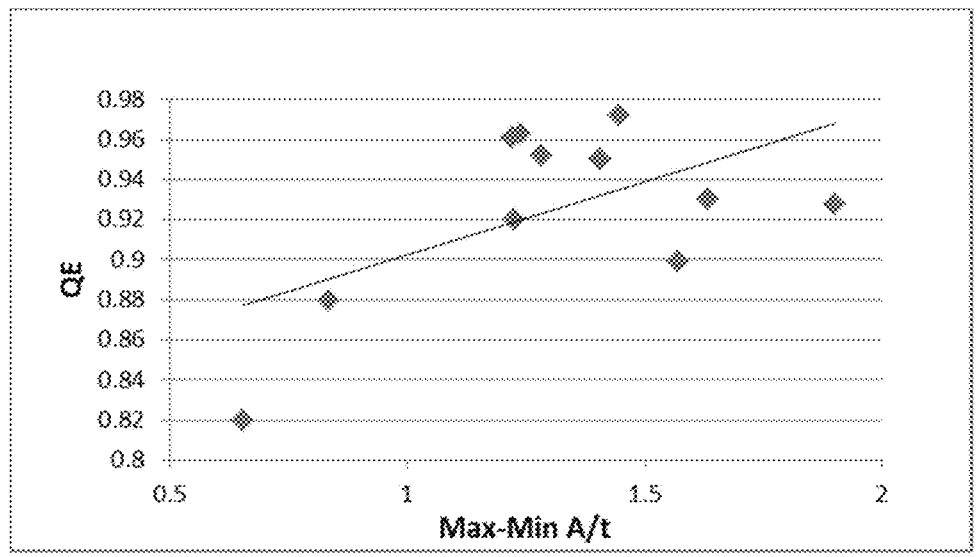
FIG. 5 is a plot of quantum efficiency versus the thickness-normalized absorbance peak height.
Figure 6:
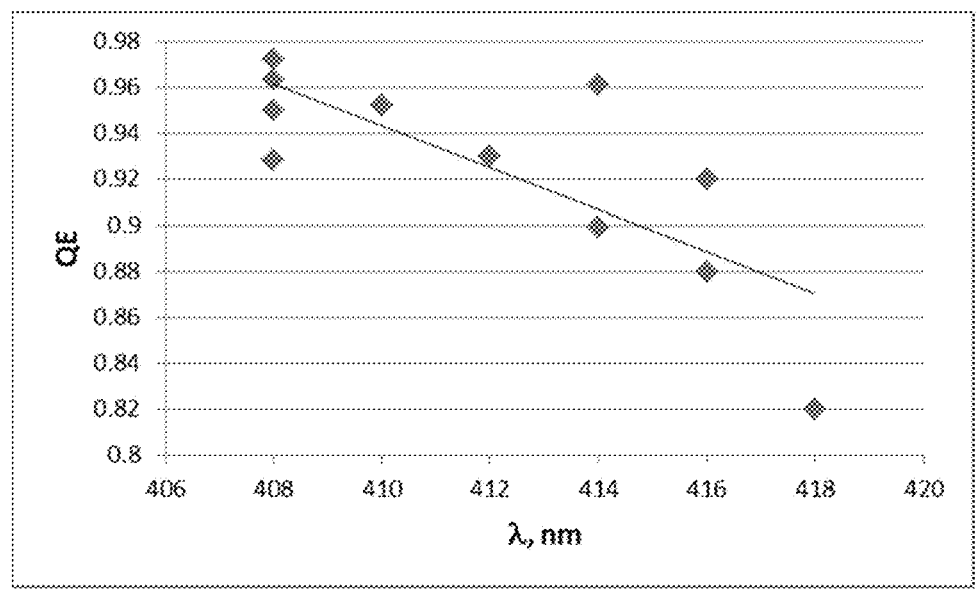
FIG. 6 is a plot of quantum efficiency versus wavelength).

FIG. 4 is a graph showing absorbance normalized to thickness (A/t) of composite glass/phosphor films as a function of wavelength. The quantum efficiency (QE) of composite glass/phosphor films is related to measured transmission spectra. In particular it is desirable to produce a glass-phosphor composite, where the phosphor is for example, Ce-doped YAG, wherein the transmission of the glass component is as high as possible in the blue range, namely 400 to 500 nm range. In this way, the maximum quantum efficiency can be achieved as the phosphor absorbs substantially all the available photons capable of exciting fluorescence in the phosphor. In particular, the correlation of quantum efficiency and the thickness-normalized absorbance peak height 32 (in FIG. 4) is shown in FIG. 5 and the correlation of quantum efficiency and the wavelength of the local minima in A/t 34 (in FIG. 4) is shown in FIG. 6, both figures demonstrating the good correlation of absorbance data to QE. In embodiments, the wavelength of the A/t minimum can be below about 416 nm to achieve a quantum efficiency of over 90%. Similarly, the A/t peak height as shown generally exceeds 1 to achieve quantum efficiency over 90%.

Exemplary glasses are shown in Tables 2-14, where compositions are given in terms of mol %. Tg, Tx, α300 refer to the glass transition temperature (over the range of 25° C. to 300° C.), temperature of the onset of crystallization, thermal expansion coefficient at 300° C., respectively. Softening point refers to the temperature at which the glass viscosity is Log $10^{7.6}$. n473, n532, n633 refer to the refractive index measured at 473 nm, 532 nm, and 633 nm, respectively.

TABLE 2

| Mol % | Examples | | | | | | | |
|---|---|---|---|---|---|---|---|---|
|  | 1 | 2 | 3 | 4 | 5 | 6 | 7 | 8 |
| $Bi_2O_3$ | 20 | 20 | 22.5 | 22.5 | 20 | 20 | 25 | 20 |
| $Li_2O$ |  |  |  | 2.5 |  |  |  |  |
| $Na_2O$ |  | 10 | 10 | 5 | 10 | 10 | 10 | 20 |
| $K_2O$ |  |  |  | 2.5 |  |  |  |  |
| ZnO | 40 | 30 | 27.5 | 27.5 | 30 | 30 | 25 | 20 |
| $B_2O_3$ | 40 | 40 | 40 | 40 | 37.5 | 35 | 40 | 40 |
| $P_2O_5$ |  |  |  |  | 2.5 | 5 |  |  |
| Tg | 433 | 417 | 411 | 389 | 407 | 425 | 403 | 357 |
| Tx |  | 580 | 566 | 555 |  |  | 569 | 492 |

TABLE 2-continued

| Mol % | Examples | | | | | | | |
|---|---|---|---|---|---|---|---|---|
|  | 1 | 2 | 3 | 4 | 5 | 6 | 7 | 8 |
| n473 |  | 1.935 | 1.963 |  |  |  |  |  |
| n532 |  | 1.914 | 1.94 |  |  |  |  |  |
| n633 |  | 1.892 | 1.917 |  |  |  |  |  |

TABLE 3

| Mol % | Examples | | | | | | | |
|---|---|---|---|---|---|---|---|---|
|  | 9 | 10 | 11 | 12 | 13 | 14 | 15 | 16 |
| $Bi_2O_3$ | 20 | 20 | 20 | 20 | 20 | 20 | 17.5 | 20 |
| $Na_2O$ |  | 10 |  |  |  |  | 10 | 15 |
| $K_2O$ |  |  |  | 10 |  |  |  |  |
| ZnO | 20 | 20 | 45 | 35 | 20 | 30 | 32.5 | 25 |
| BaO | 20 | 10 |  |  | 10 |  |  |  |
| $B_2O_3$ | 40 | 40 | 35 | 45 | 40 | 50 | 40 | 40 |
| Tg | 421 | 394 | 415 | 439 | 366 | 449 | 422 | 388 |
| Tx |  |  | 570 |  |  |  |  | 539 |
| n473 |  |  |  |  |  |  | 1.906 |  |
| n532 |  | 1.903 |  |  |  |  | 1.886 |  |
| n633 |  | 1.882 |  |  |  |  | 1.867 |  |

TABLE 4

| Mol % | Examples | | | | | | | |
|---|---|---|---|---|---|---|---|---|
|  | 17 | 18 | 19 | 20 | 21 | 22 | 23 | 24 |
| $Bi_2O_3$ | 20 | 15 | 15 | 15 | 15 | 15 | 13 | 13 |
| $Li_2O$ |  |  |  | 5 | 5 |  |  | 5 |
| $Na_2O$ |  | 10 | 15 | 15 | 10 | 10 | 15 | 10 |
| ZnO | 30 | 30 | 25 | 30 | 30 | 25 | 27 | 27 |
| BaO | 10 | 10 | 10 | 5 | 5 | 10 | 10 | 10 |
| $B_2O_3$ | 40 | 35 | 35 | 35 | 35 | 35 | 35 | 35 |
| Tg | 435 | 402 | 379 | 385 | 377 | 373 | 387 | 379 |
| Tx |  |  | 530 |  | 526 | 456 | 472 | 543 | 458 |
| α300 |  | 103 | 116 |  |  |  | 115 |  |
| n473 |  |  |  |  |  |  |  |  |
| n532 |  |  | 1.843 |  |  |  | 1.819 |  |
| n633 |  |  | 1.825 |  |  |  | 1.8025 |  |

TABLE 5

| Mol % | Examples | | | | | | | |
|---|---|---|---|---|---|---|---|---|
|  | 25 | 26 | 27 | 28 | 29 | 30 | 31 | 32 |
| $Bi_2O_3$ | 17 | 17 | 15 | 15 | 16 | 20 | 16 | 15 |
| $Li_2O$ |  | 5 |  |  |  |  |  |  |
| $Na_2O$ | 15 | 10 | 15 | 15 | 10 | 5 | 5 | 10 |
| ZnO | 23 | 23 | 12.5 |  | 21.3 | 25 | 26.5 | 21.3 |
| $ZnF_2$ |  |  | 12.5 | 25 |  |  |  |  |
| BaO | 10 | 10 | 10 | 10 | 10 | 10 | 10 | 10 |
| $B_2O_3$ | 35 | 35 | 35 | 35 | 42.7 | 40 | 42.5 | 43.7 |
| Tg | 377 | 367 | 363 | 355 | 412 | 421 | 439 | 427 |
| Tx | 528 | 469 |  |  |  |  |  |  |
| α300 | 119 |  |  |  |  |  | 115 |  |
| n532 | 1.867 |  |  |  | 1.852 | 1.927 | 1.875 |  |
| n633 | 1.847 |  |  |  | 1.835 | 1.906 | 1.8575 |  |
| Softening point |  |  |  |  | 484.9 |  |  |  |

TABLE 6

| Mol % | Examples | | | | | | | |
|---|---|---|---|---|---|---|---|---|
| | 33 | 34 | 35 | 36 | 37 | 38 | 39 | 40 |
| $Bi_2O_3$ | 16 | 16 | 16 | 16 | 16 | 16 | 15 | 16 |
| $Li_2O$ | 5.25 | | 1.75 | | | | | |
| $Na_2O$ | 6 | 2.5 | 2 | 1.75 | 5 | 3.5 | 2.1 | 2.8 |
| $K_2O$ | 3.75 | | 1.25 | 2 | | 4 | 2.4 | 3.2 |
| $Cs_2O$ | | 2.5 | | 1.25 | 2.5 | 2.5 | 1.5 | 2 |
| ZnO | 23.5 | 26.5 | 26.5 | 26.5 | 26.5 | 23.5 | 26.5 | 23.5 |
| BaO | | 10 | 2.5 | 10 | 7.5 | 5 | 2.5 | 2.5 |
| $Al_2O_3$ | 3 | | | | | | | |
| $B_2O_3$ | 42.5 | 42.5 | 50 | 42.5 | 42.5 | 45.5 | 50 | 50 |
| Tg | 409 | 433 | 459 | 427 | 423 | 409 | 447 | 434 |
| Tx | 582 | | | | | | | |
| α300 | | | | | | | | |
| n473 | | | | | | | | |
| n532 | | 1.826 | 1.852 | 1.848 | 1.851 | 1.851 | | |
| n633 | | 1.81 | 1.835 | 1.83 | 1.834 | 1.834 | | |
| density | | | 4.901 | | | | | |
| Softening point | | | | | | | 515.1 | |

TABLE 7

| Mol % | Examples | | | | | | | |
|---|---|---|---|---|---|---|---|---|
| | 41 | 42 | 43 | 44 | 45 | 46 | 47 | 48 |
| $Bi_2O_3$ | 15.5 | 15 | 15.5 | 14 | 14 | 14 | 14 | 14 |
| $Na_2O$ | 1.925 | 2.1 | 3.5 | 10.8 | 10.8 | 5.8 | 10.8 | 10.8 |
| $K_2O$ | 2.2 | 2.4 | 4 | | | 5 | | |
| $Cs_2O$ | 1.375 | 1.5 | 2.5 | | | | | |
| ZnO | 26.5 | 28.5 | 26.5 | 21.5 | 26.5 | 21.5 | 21.5 | 16.5 |
| BaO | 10 | 8 | 5.5 | 10.7 | 10.7 | 10.7 | 15.7 | 15.7 |
| $B_2O_3$ | 42.5 | 42.5 | 42.5 | 43 | 38 | 43 | 38 | 43 |
| Tg | 425 | 427 | 406 | 417 | 407 | 410 | 403 | 411 |

TABLE 7-continued

| Mol % | Examples | | | | | | | |
|---|---|---|---|---|---|---|---|---|
| | 41 | 42 | 43 | 44 | 45 | 46 | 47 | 48 |
| Tx | | | | | 536 | | | |
| α300 | | | | | | | | |
| n473 | | | | | | | | |
| n532 | | | | | | | | |
| n633 | | | | | | | | |
| softening point | 494.3 | | | | | | | |

TABLE 8

| Mol % | Examples | | | | | | | |
|---|---|---|---|---|---|---|---|---|
| | 49 | 50 | 51 | 52 | 53 | 54 | 55 | 56 |
| $Bi_2O_3$ | 14 | 14 | 14 | 13 | 15 | 15 | 15 | 15 |
| $Na_2O$ | 5.8 | 5.8 | 5.8 | 10.9 | 13.7 | 10 | 10 | 13.7 |
| $K_2O$ | 5 | 5 | 5 | | | | | |
| ZnO | 16.5 | 26.5 | 21.5 | 21.8 | 21.3 | 21.3 | 21.3 | 21.3 |
| BaO | 15.7 | 10.7 | 15.7 | 10.8 | 10 | 13.7 | 10 | 13.7 |
| $B_2O_3$ | 43 | 38 | 38 | 43.5 | 40 | 40 | 43.7 | 36.3 |
| Tg | 409 | 404 | 403 | 420 | 419 | 424 | 428 | 404 |
| Tx | 516 | | | | | | | |
| α300 | | | | | | | | |
| n473 | | | | | | 1.8636 | | |
| n532 | | | | | 1.8675 | 1.8485 | | |
| n633 | | | | | 1.8486 | 1.8302 | | |

TABLE 9

| Mol % | Examples | | | | | | | |
|---|---|---|---|---|---|---|---|---|
| | 57 | 58 | 59 | 60 | 61 | 62 | 63 | 64 |
| $Bi_2O_3$ | 15 | 15 | 15 | 15 | 12 | 15 | 15 | 15 |
| $Na_2O$ | 10 | 10 | 11 | 10 | 10 | 10 | 10 | 10 |
| ZnO | 20 | 15 | 18 | 20 | 33 | 29.8 | 27.3 | 22.3 |
| BaO | 10 | 10 | 6 | 15 | 15 | 2.5 | 5 | 10 |
| $B_2O_3$ | 45 | 50 | 50 | 40 | 30 | 42.7 | 42.7 | 42.7 |
| $MoO_3$ | | | | | | | | 0.5 |
| Tg | 415 | | | 428 | 414 | 429 | 426 | 419 |
| Tx | | | | | | | | |
| α300 | | | | | | | | 9.39 |

TABLE 9-continued

| Mol % | Examples | | | | | | | |
|---|---|---|---|---|---|---|---|---|
| | 57 | 58 | 59 | 60 | 61 | 62 | 63 | 64 |
| n473 | | | | 1.8815 | 1.8726 | 1.8628 | | |
| n532 | | | | 1.8634 | 1.8566 | 1.8463 | | |
| n633 | | | | 1.8469 | 1.8392 | 1.829 | | |

TABLE 10

| Mol % | Examples | | | | | | | |
|---|---|---|---|---|---|---|---|---|
| | 65 | 66 | 67 | 68 | 69 | 70 | 71 | 72 |
| $Bi_2O_3$ | 15 | 15 | 15 | 15 | 15 | 15 | 15 | 15 |
| $Na_2O$ | 10 | 10 | 10 | 8 | 10 | 10 | 10 | 10 |
| ZnO | 22.3 | 22.3 | 22.5 | 24.5 | 22.3 | 22.3 | 22.3 | 22.3 |
| BaO | 10 | 10 | 2.5 | 2.5 | 10 | 10 | 10 | 10 |
| $B_2O_3$ | 42.7 | 42.7 | 50 | 50 | 40.2 | 37.7 | 42.7 | 32.7 |
| $WO_3$ | 0 | 1 | 0.5 | 0.5 | 0 | 0 | 0 | 0 |
| $MoO_3$ | 1 | 0 | 0 | 0 | 0 | 0 | 0 | 0 |
| $SiO_2$ | 0 | 0 | 0 | 0 | 2.5 | 5 | 0 | 10 |
| Tg | 421 | 421 | 443 | 454 | 422 | 424 | 419 | 424 |
| Tx | | | | | | | | |
| α300 | | | | 8.5 | | 10.2 | 9.95 | 10.09 |
| n473 | 1.8579 | 1.8607 | | 1.8441 | 1.8605 | | 1.8438 | 1.8559 |
| n532 | 1.8415 | 1.844 | | 1.8282 | 1.8438 | | 1.8272 | 1.8392 |
| n633 | 1.8245 | 1.8269 | | 1.8125 | 1.8269 | | 1.812 | 1.8229 |
| density | 4.967 | | | | | | 4.988 | |
| Softening point | | | | 519.3 | 495.3 | 496.6 | 493.3 | 499.3 |

TABLE 11

| Mol % | Examples | | | | | | | |
|---|---|---|---|---|---|---|---|---|
| | 73 | 74 | 75 | 76 | 77 | 78 | 79 | 80 |
| $Bi_2O_3$ | 15 | 15 | 15 | 15 | 15 | 15 | 15 | 15 |
| $Na_2O$ | 10 | 8 | 8 | 8 | 8 | 0 | 0 | 8 |
| ZnO | 21.3 | 22.3 | 22.5 | 24.5 | 27 | 20 | 25 | 22 |
| BaO | 8 | 8 | 4.5 | 2.5 | 0 | 15 | 10 | 2.5 |
| $B_2O_3$ | 40.7 | 41.7 | 48 | 48 | 50 | 50 | 50 | 50 |
| $SiO_2$ | 5 | 5 | 2 | 2 | 2.5 | 5 | 0 | 0 |
| MgO | 0 | 0 | 0 | 0 | 0 | 0 | 0 | 2.5 |
| Tg | 430 | 440 | 451 | 453 | 456 | 467 | 472 | 455 |
| Tx | | | | | | | | |
| α300 | 9.59 | 9.27 | | 8.52 | 8.24 | 8.73 | 7.97 | |
| n473 | 1.8575 | 1.8681 | | 1.8548 | 1.8393 | 1.8565 | 1.8559 | 1.8361 |
| n532 | 1.8408 | 1.8505 | | 1.8381 | 1.8245 | 1.8415 | 1.841 | 1.8208 |
| n633 | 1.8239 | 1.8333 | | 1.8216 | 1.8086 | 1.8258 | 1.825 | 1.8046 |
| density | | | | 4.812 | | | | |
| Softening point | 503.5 | 511 | | 519.1 | | | | |

TABLE 12

| Mol % | Examples | | | | | | | |
|---|---|---|---|---|---|---|---|---|
| | 81 | 82 | 83 | 84 | 85 | 86 | 87 | 88 |
| $Bi_2O_3$ | 15 | 15 | 15 | 15 | 15 | 15 | 15 | 15 |
| $Na_2O$ | 6 | 10 | 10 | 10 | 8 | 10 | 10 | 10 |
| ZnO | 26.5 | 22.3 | 20.3 | 20.3 | 25 | 22.3 | 22.3 | 22.3 |
| BaO | 2.5 | 10 | 10 | 12 | 11 | 10 | 10 | 10 |
| $B_2O_3$ | 50 | 42.7 | 42.7 | 42.7 | 41 | 42.7 | 42.7 | 42.7 |
| $SiO_2$ | 0 | 0 | 2 | 0 | 0 | 0 | 0 | 0 |

TABLE 12-continued

| Mol % | Examples | | | | | | | |
|---|---|---|---|---|---|---|---|---|
| | 81 | 82 | 83 | 84 | 85 | 86 | 87 | 88 |
| $Eu_2O_3$ | 0 | 0 | 2 | 0 | 0 | 1.5 | 0.5 | 0.15 |
| Tg | 458 | 422 | 424 | 420 | 425 | 426.5 | 425 | 423 |
| Tx | | | | | | 519 | | |
| α300 | 8.12 | 9.81 | 9.99 | 10.27 | 10.01 | | | |
| n473 | 1.8457 | 1.8552 | 1.8496 | 1.8545 | 1.8662 | | | |
| n532 | 1.8307 | 1.8385 | 1.8331 | 1.838 | 1.8495 | | | |
| n633 | 1.8159 | 1.8217 | 1.8169 | 1.8213 | 1.8322 | | | |

TABLE 13

| Mol % | Examples | | | | | | | |
|---|---|---|---|---|---|---|---|---|
| | 89 | 90 | 91 | 92 | 93 | 94 | 95 | 96 |
| $Bi_2O_3$ | 15 | 14.5 | 14.5 | 14.5 | 14.5 | 15 | 14 | 14 |
| $Na_2O$ | 10 | 10 | 10 | 10 | 10 | 10 | 10 | 10 |
| ZnO | 20 | 21.8 | 22 | 21.9 | 21 | 22.3 | 22.3 | 22.3 |
| BaO | 7 | 8 | 8.8 | 8.4 | 7.8 | 2 | 7 | 4 |
| $B_2O_3$ | 41 | 42.7 | 42.7 | 42.7 | 42.7 | 42.7 | 42.7 | 42.7 |
| $SiO_2$ | 0 | 0 | 0 | 0 | 0 | 0 | 0 | 0 |
| $Eu_2O_3$ | 7 | 3 | 2 | 2.5 | 4 | 4 | 4 | 4 |
| Tg | 443 | 439 | 430 | 434 | 437 | 443 | 440 | 444 |
| Tx | 585 | | | | | | | |
| α300 | | | | | | 9.11 | 9.61 | 9.14 |
| n473 | | | | | | 1.8779 | 1.8621 | 1.8651 |
| n532 | | | | | | 1.8611 | 1.8459 | 1.8487 |
| n633 | | | | | | 1.8447 | 1.8299 | 1.8328 |

TABLE 14

| | Examples | | | | |
|---|---|---|---|---|---|
| | 97 | 98 | 99 | 100 | 101 |
| Mol % | | | | | |
| $Bi_2O_3$ | 13.5 | 15 | 15 | 15 | 15 |
| $Na_2O$ | 10 | 6 | 6 | 6 | 6 |
| ZnO | 22.3 | 26.5 | 26.5 | 26.5 | 26.5 |
| BaO | 8 | 1.25 | 0 | 0 | 0.5 |
| SrO | | 1.25 | 2.5 | 0 | 1 |
| CaO | | 0 | 0 | 2.5 | 1 |
| $B_2O_3$ | 41 | 50 | 50 | 50 | 50 |
| $Eu_2O_3$ | 4 | | | | |
| Tg | 441 | 462.2 | 462.2 | 463.3 | 463.3 |
| Tx | | | | | |
| α300 | 9.6 | | | | |
| n473 | 1.8575 | | | | |
| n532 | 1.8423 | | | | |
| n633 | 1.8261 | | | | |

The disclosure is directed to glass containing at least one phosphor; and to a process whereby a phosphor powder, or plurality of different phosphor powders, is combined with a suitable fritted glass material, the "frit glass", and a liquid organic vehicle (for example without limitation, terpineol, ethylcellulose with dispersants and surfactants) to form a frit paste. The paste is then deposited on a compatible substrate (a substrate whose CTE is matched to within $2 \times 10^{-6}/^\circ$ C. of the frit glass), for example without limitation, by screen printing or spraying, (screen print, or spray) and then heated to a suitable first temperature to drive of the organic vehicle and then heated to a higher second temperature to consolidate the phosphor/frit glass mixture into a dense phosphor-containing glass. The phosphor may comprise quantum dots, for example, quantum dots having a particle size ranging from 1 to 10 nm.

The first temperature is for driving off the organic vehicle and it is determined by, for example, the boiling point of the organic vehicle or the use of vapor pressure data and can be carried out at atmospheric pressure or under vacuum. The second higher temperature that is used to consolidate or fire the phosphor/frit glass mixture into a dense glass is determined by the frit material, with the provision that the softening temperature of the substrate to which the phosphor/frit glass mixture is applied has to be at least 100° C. higher than the consolidation or firing temperature of the phosphor/frit glass mixture. This phosphor/frit glass mixture can be applied as a layer on or adjacent to the active plane of a LED device. The amount of phosphor powder in the phosphor/frit glass mixture can be varied to the desired amount. The ultimate thickness of the consolidated phosphor-contain frit layer can be increased by a plurality of depositions of the phosphor/frit glass mixture.

In various embodiments, the phosphor powder can be homogeneously distributed throughout the glass. In further embodiments, the distribution of phosphor powder can be localized within the glass, i.e., at one or both of the free surfaces of the glass layer.

The phosphor-containing frit glass mixture materials are different from the same frit material without the phosphor. Specifically, the addition of a specific phosphor phase to the frit material alters the rheological properties of the resulting phosphor-frit glass paste and the subsequent consolidation thermal treatment. The consolidation thermal treatment must be such that it does not degrade the fluorescent property of the phosphor. This is an important factor in the choice of the frit glass and the subsequent processing. It is the appropriate finding of this combination of the properties, namely the frit glass composition, the particular phosphor material and the glass substrate, that constitute various embodiments of the instant disclosure. Because of the temperature limitation of the phosphor-frit glass material and the potential for degradation of certain phosphor materials, for example, Ce/YAG, or for reaction between frit glass and the phosphor materials, embodiments relate to the use of frit materials whose sintering temperature or flowing temperature is sufficient low such that the phosphors present in a phosphor-frit mixture are not degraded. The result of this restriction is that higher CTE frit materials are typically used, which can, in turn, impact the choice of the substrate glass so that the CTE of the phosphor-containing frit glass formed by firing a phosphor-frit glass mixture will match the substrate CTE.

Phosphor materials are commercially available from Beijing Yugi Science & Technology Co. Ltd. (Beijing, China), Shanghai Keyan Phosphor Technology Co. Ltd (Shanghai, China) and Litec-LLL GmbH (Greifswald, Germany); and have also been described in patents and technical literature, for example, U.S. Pat. Nos. 6,572,785 and 7,442,326, and W. J. Park et al., "*Enhanced Luminescence Efficiency for Bi, Eu doped $Y_2O_3$ Red Phosphors for White LEDs*," Solid State Phenomena, Vols. 124-126 (2007), pages 379-382, and Rong-Jun Xie et al., "*Silicon-based oxynitride and nitride phosphors for white LEDs—A review*," Science and Technology of Advanced Materials 8 (2007), pages 588-600.

Figure 2:
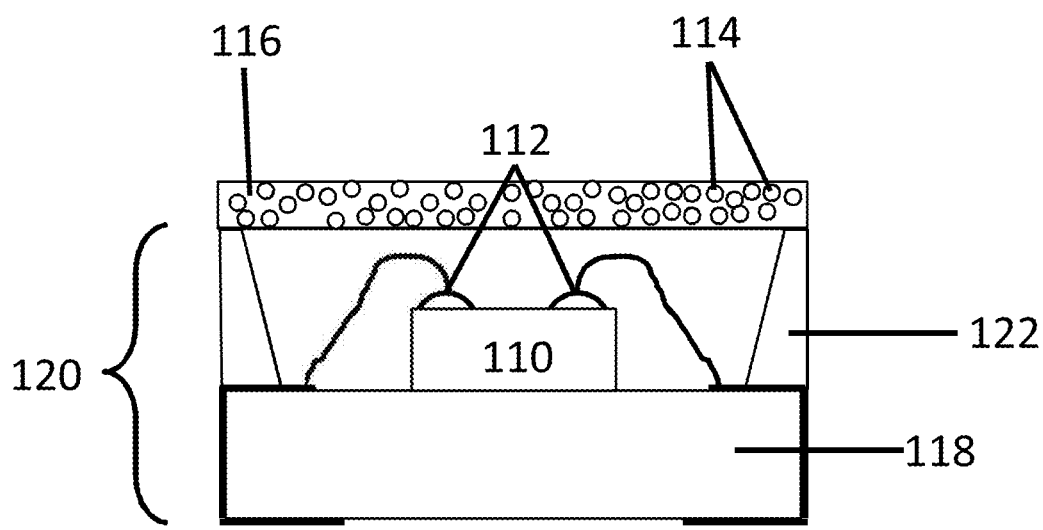
FIG. 2 is an illustration of features of a device in accordance with embodiments of the present disclosure in which a consolidated phosphor-containing glass layer is formed by tape casting the glass frit material mixed with one or a plurality of phosphors and firing the casted phosphor-frit glass layer.

As indicated above, FIG. 1 is a drawing of a white light LED in a typical surface mount package, FIG. 1 illustrates the LED 10, wire bonds 12, phosphor particles 14 (illustrated as circular dots) in a silicone material 16 surrounding phosphor particles 14, a substrate 18 and a package 20 for a LED, for example, an Marubeni SMTW47 InGaN LED (http://tech-led.com/data/L850-66-60-130.pdf). The package 20 comprises a substrate 18, an epoxy resin lens 24, and a vessel or cup 22 made from white plastic or ceramic to contain the silicone-phosphor mixture, protect the LED, and to reflect the light from the package. In FIG. 2, a phosphor 114 (illustrated as circular dots) has been mixed with a glass frit 116 to form a phosphor/frit glass mixture and fired to create a glass sheet. In addition, FIG. 2 illustrates the package 120, which comprises the LED 110, wire bonds 112 and package substrate 118 and the vessel or cup 122. The phosphor/frit glass mixture material (114,116) can also be applied to a substrate using standard paste processes, by a screen printing, or by spraying, followed by firing to produce a dense phosphor/frit glass layer overlying the substrate. As a result of incorporating the phosphor into a glass layer numerous advantages are obtained over the practice of mixing the phosphor into a silicone or epoxy material.

In particular, the phosphor/frit glass layer and the resulting device overall are thermally more robust than when a silicone is used as the encapsulation material, and the phosphor/frit glass layer has better chemical and environmental stability. For example, one can incorporate red and yellow phosphors into a single frit glass blend. Since the phosphor/frit glass blend can be formed into a "paste" of varying fluidity, the blends are suitable for thick film application to the active plane. Example liquids used to form the blend include various solvent mixtures, including a mixture of propylene glycol diacetate and dimethyl carbonate. Other advantages include (1) reduced backscatter because the frit glass material can be chosen so that there is phosphor/frit glass materials achieve a better refractive index match between the phosphor and the frit glass and the layer containing the pn-junction (the LED); and (2) the ability to make geometric patterns of the phosphor on the substrate. Finally, the use of the phosphor/frit glass blend imparts the ability to control the packaged LED color or white point. Since the phosphor-containing plate is made as a separate piece, the optical thickness and emission color can be measured before assembly, thus reducing the number of reject LEDs.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

We claim:

1. A method for making a glass article comprising:
providing a glass composition comprising $Bi_2O_3$ and at least 30 mol % $B_2O_3$;
melting the composition and forming the melted composition into a glass;
grinding the glass into particles to form a frit glass having the composition;
blending the frit glass with one or a more phosphors to form a phosphor-frit glass mixture;
converting the phosphor-frit glass mixture into a paste by adding at least one organic liquid to the mixture;
applying the paste onto a surface; and
firing the applied paste to burn out organic material to form a phosphor-frit glass.

2. The method according to claim 1, further comprising cooling the fired phosphor-frit glass to room temperature after the firing.

3. The method according to claim 1, wherein the firing comprises firing the applied paste in air to a temperature of approximately 350° C. at a temperature ramp rate of 2° C./min and holding the paste at approximately 350° C. for 1 hour to burn out the organic material.

4. The method according to claim 1, wherein the firing comprises firing the applied paste in air to a selected temperature in the range of 475-600° C. at a temperature ramp rate of 2° C./min and holding the applied paste at the selected temperature for 2 hours.

5. The method according to claim 1, wherein the applying comprises screen printing or tape casting the paste onto the surface.

6. The method according to claim 1, wherein the blending comprises mixing the frit glass and the one or more phosphors with a solvent mixture comprising propylene glycol diacetate and dimethyl carbonate.

* * * * *